United States Patent
Lu et al.

(10) Patent No.: US 10,640,003 B2
(45) Date of Patent: May 5, 2020

(54) DOUBLE-PULSE TEST SYSTEMS AND METHODS

(71) Applicant: Ford Global Technologies, LLC, Dearborn, MI (US)

(72) Inventors: Xi Lu, Northville, MI (US); Chingchi Chen, Ann Arbor, MI (US); Zhuxian Xu, Novi, MI (US); Krishna Prasad Bhat, Belleville, MI (US); Lan Yu, Canton, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 308 days.

(21) Appl. No.: 15/617,640

(22) Filed: Jun. 8, 2017

(65) Prior Publication Data

US 2018/0354384 A1     Dec. 13, 2018

(51) Int. Cl.
| | |
|---|---|
| *G01R 31/26* | (2020.01) |
| *B60L 11/18* | (2006.01) |
| *G01R 31/392* | (2019.01) |
| *B60L 58/12* | (2019.01) |
| *G01R 31/327* | (2006.01) |
| *H01M 10/46* | (2006.01) |
| *H01M 10/48* | (2006.01) |

(Continued)

(52) U.S. Cl.
CPC ........... *B60L 11/1861* (2013.01); *B60L 58/12* (2019.02); *G01R 31/261* (2013.01); *G01R 31/3277* (2013.01); *G01R 31/392* (2019.01); *H01M 10/46* (2013.01); *H01M 10/48* (2013.01); *B60K 6/28* (2013.01); *B60Y 2200/91* (2013.01); *B60Y 2200/92* (2013.01); *B60Y 2400/112* (2013.01); *G01R 31/006* (2013.01); *G01R 31/2621* (2013.01); *H01M 2010/4271* (2013.01); *H01M 2220/20* (2013.01); *Y10S 903/907* (2013.01)

(58) Field of Classification Search
None
See application file for complete search history.

(56) References Cited

U.S. PATENT DOCUMENTS

| | | | |
|---|---|---|---|
| 3,979,672 A | 9/1976 | Arnoldi | |
| 5,488,269 A * | 1/1996 | El-Hamamsy | H02M 1/4241 |
| | | | 315/209 R |

(Continued)

FOREIGN PATENT DOCUMENTS

| | | |
|---|---|---|
| CN | 103399270 A | 11/2013 |
| CN | 103675558 A | 3/2014 |

*Primary Examiner* — Paresh Patel
(74) *Attorney, Agent, or Firm* — David B. Kelley; Brooks Kushman P.C.

(57) ABSTRACT

The methods and systems for correcting for an inductive load when testing high voltages devices are described. A high voltages device is a device under test (DUT) in a double-pulse test, which may require the inductive load. The method can include in a low current, high voltage time period, estimating an inductor current contribution range after a turn on of the device-under-test connected to an inductive load with an air core inductor. The method subtracts the estimated inductor current contribution from a device-under-test collector current to output a corrected collector current. This allows the double pulse test to be conducted with an air-core inductor. Vehicles can use the DUT in traction power applications.

7 Claims, 4 Drawing Sheets

(51) Int. Cl.
*G01R 31/00* (2006.01)
*H01M 10/42* (2006.01)
*B60K 6/28* (2007.10)

(56) References Cited

U.S. PATENT DOCUMENTS

| | | | | |
|---|---|---|---|---|
| 2006/0238203 A1* | 10/2006 | Kelley | ............... | G01R 31/389 |
| | | | | 324/433 |
| 2012/0182031 A1* | 7/2012 | Tokumoto | ........... | G01R 31/2621 |
| | | | | 324/750.01 |
| 2013/0181750 A1* | 7/2013 | Lobsiger | ........... | H03K 17/08148 |
| | | | | 327/109 |
| 2014/0139206 A1* | 5/2014 | Hirose | ............... | G01R 1/06766 |
| | | | | 324/132 |
| 2014/0372054 A1* | 12/2014 | Wang | ............... | G01R 31/3842 |
| | | | | 702/63 |
| 2014/0375362 A1* | 12/2014 | Lobsiger | ............... | H03K 17/00 |
| | | | | 327/109 |
| 2015/0162902 A1* | 6/2015 | Lizama | ............... | H03K 17/082 |
| | | | | 327/376 |
| 2016/0005732 A1* | 1/2016 | Wood | ............... | H01L 29/1004 |
| | | | | 257/134 |

\* cited by examiner

DOUBLE-PULSE TEST SYSTEMS AND METHODS

TECHNICAL FIELD

The present disclosure is directed to testing power semiconductor devices, in particular to methods and systems for double-pulse testing devices, e.g., vehicle power electronics.

BACKGROUND

Double pulse tests can be used to determine the operating characteristics of a power semiconductor. A typical inductor with a magnetic core is used as a current source to the power semiconductor. A magnetic core inductor can realize a high inductance easily; however, it has some drawbacks, e.g., (1) its inductance varies with the current level and (2) it can even be saturated at a higher current. Switching loss evaluation using a double pulse test usually requires a wide range of current levels (e.g. 1 A to 1000 A), therefore, an inductor with a magnetic core is not an ideal candidate for this application.

SUMMARY

A double-pulse test method and systems are described, which provide for a correction in the sensed current by correcting for the contribution by the inductor. In an example a low current, high voltage time period, an inductor current contribution range is estimated after a turn on of the device-under-test connected to an inductive load with an air core inductor. Then the estimated inductor current contribution is subtracted from a device-under-test collector current to output a corrected collector current.

In an example embodiment, the method includes estimating the inductor current includes sensing a first voltage across a supply capacitor, sensing a second voltage across the device-under-test, and using the first voltage and the second voltage to estimate the inductor current change.

In an example embodiment, the method includes estimating includes calculating using the equation $$di_L = \frac{v_L}{L}dt = \frac{v_C - v_{ce}}{L}dt$$

where $v_c$ is first voltage, $v_{ce}$ is the second voltage, L is the inductance of the load inductor, and dt is a change in time.

In an example embodiment, estimating the inductor current includes setting a first voltage as a constant to represent a supply voltage or extracting the high-level portion of the sensed second voltage, sensing a second voltage across the device-under-test, and using the first voltage and the second voltage to estimate the inductor current change.

A vehicle can use the tested device. The vehicle will include a high voltage traction battery, power control circuitry connected to the traction battery and an electric machine. A power integrated circuit is provided and may have its performance measured by in a low current, high voltage time period, estimating an inductor current contribution range after a turn on of the device-under-test connected to an inductive load with an air core inductor, and subtracting the estimated inductor current contribution from a device-under-test collector current to output a corrected collector current. The vehicle may also have a controller to estimate a power in the traction battery.

In an example embodiment of a vehicle, estimating the inductor current includes sensing a first voltage across a supply capacitor, sensing a second voltage across the device-under-test, and using the first voltage and the second voltage to estimate the inductor current change.

In an example embodiment, the inductor is an air core inductor in any of the above example embodiments.

In an example embodiment, the inductor used in any of the above example embodiments has an inductance of about 1 uH to 1 mH or about 10-20 µH.

DETAILED DESCRIPTION

Figure 1A:
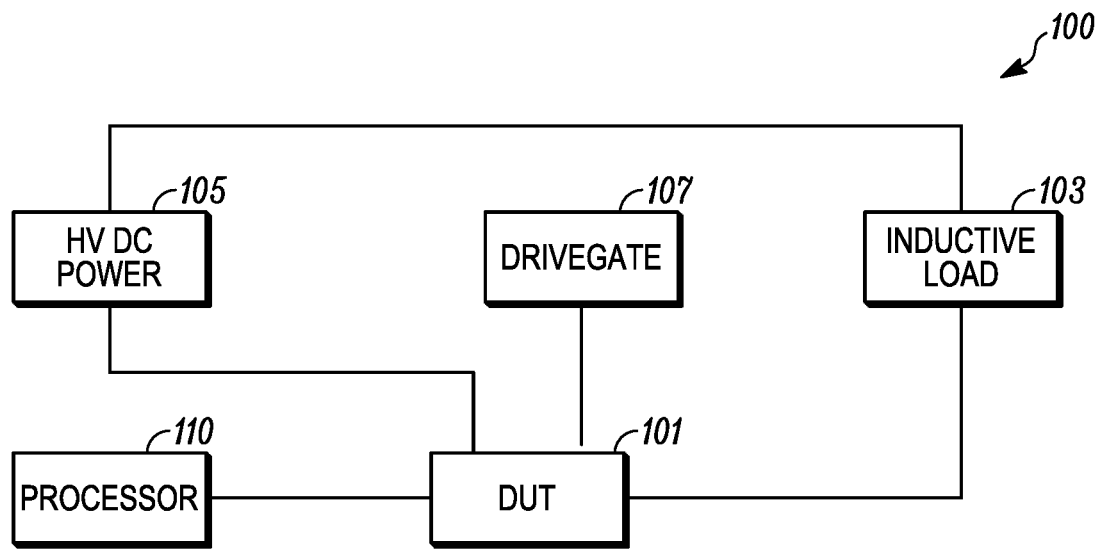
FIG. 1A is a schematic view of a testing system according to an example embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

A double pulse test provides methods and systems to test the gate drive and dynamic behavior of power electronics components under a variety of conditions, using almost negligible power. The presently described methods and systems can be used to test power circuitry and power circuit elements for electric or hybrid vehicles. The power electronics switch to provide 100 or more volts from a traction battery. The double pulse test can assert a test signal that has two pulses therein to a device under test. In the double pulse test of a device under test (DUT), the testing device typically includes a large magnetic inductor with a magnetic core to provide a load to approximate a current source that feeds to the DUT. This large inductor is to ensure the current is almost flat at the steady state during the duration of a switching transient in the DUT. However, such an inductor introduces drawbacks during testing, e.g., its inductance varies with the current level and it can be saturated at a higher current. Switching loss evaluation of the DUT using double pulse test usually requires a wide range of current levels (e.g., 1 A to 1000 A), therefore, an inductor with a magnetic core is not an ideal candidate for this application. As a result, an air-cored inductor can be used in a system for the test. An air-cored inductor can provide various benefits. The air-cored inductor has an approximately constant inductance over a wide range of current levels. In various examples, the inductance can be about 10.0 µH, +/−0.5 µH or +/−1.0. In an example, the inductance is up to about 20

μH, +/−0.5 μH or +/−1.0. In an example, the inductance is up to about 80 μH, +/−0.5 μH or +/−1.0. In an example, the inductance can be about 1 μH to 1 mH, +/−5% or 10%. The inductor can provide an inductance in a range of about 10 μH up to about 20 μH, +/−10%. The inductor can provide an inductance in a range of about 10 μH up to about 40 μH, +/−10% or 80 μH, +/−10%. The air-cored inductor does not have the saturation problem as it does not have a magnetic core. However, air-cored inductors introduce a drawback of having a low energy density, which leads to a large size and a small inductance.

To ensure an almost constant current during the switching transients during the test, the load inductance is very high in order to satisfy the requirements at low current, high voltage operating points. As a consequence, the inductor volume is large, and hence the electrical energy stored in the inductor is large as well. However, this leads to a long time to ramp up the current at high current low voltage operating points. This also requires a lot of voltage compensation that is lost during charging the inductor. In order to solve the drawbacks of air-cores inductors, different air-cored inductors, each with a different inductance) are used for different operating conditions. For example, a small inductor is selected for low current cases, while a large inductor is selected for high current cases. The present inventors discovered the need for a testing system with a single, air-cored inductor resulting in a compact testing device. However, the single air-cored inductor is a non-ideal current source. The present inventors further discovered the need for correcting for the non-ideal current source behavior of a single air-cored inductor.

FIG. 1A shows a schematic view of a double pulse test system 100 that includes a device under test (DUT) 101 connected to an inductive load 103. A high voltage DC power source 105 supplies the main power for the test. A drive circuit 107 receives the switching signal from the processor 110 and supplies the gating signal to the device under test 101. The inductive load 103 includes a single, reasonably small air-cored inductor with a minimum parasitic capacitance.

The double pulse test can be performed in half-bridge topology, with the behavior of the device under test 101, e.g., an Insulated Gate Bipolar Transistor (IGBT), being tested with the diode in the corresponding half-bridge under different load conditions. The double pulse test makes it possible to test the gate drive and dynamic behavior of power electronics components under a variety of conditions, using almost negligible power. A double pulse test can test for device behavior at different temperatures levels, short circuit behavior, short circuit shutdown, behavior of the gate drive, adjustment of $RG_{ON}$ and $RG_{OFF}$, over-voltage behavior for turn off, current distribution when connected in parallel, diode recovery, measurement of switching energies, among other tests.

Figure 1B:
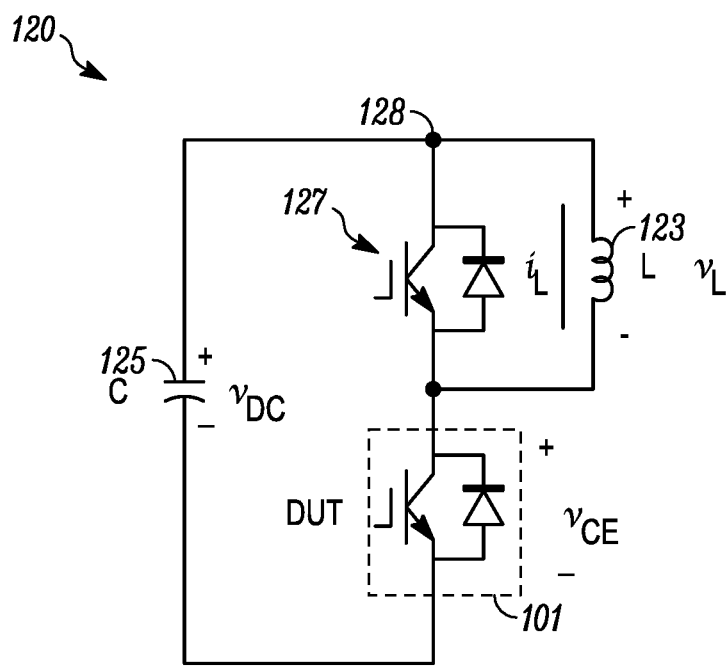
FIG. 1B is a schematic view of a testing system according to an example embodiment.

FIG. 1B shows a double pulse testing circuit 120 for testing the DUT 101. The voltage across the DUT is measured as $v_{ce}$. An inductor 123 is connected in parallel with the half bridge's upper device 127. The voltage across the inductor is $v_L$. The inductor 123 can be a single, reasonably small air-cored inductor with a minimum parasitic capacitance. The current going through the inductor 123 is $i_L$. The half bridge's upper device 127 can include a high voltage switch, e.g., an IGBT with a reverse mounted diode connected thereacross, or simply a diode. The power source is shown as a capacitor 125. The voltage across the capacitor 125 is $v_{dc}$. A first, positive node 128 connects the positive terminals of the inductor 123, the capacitor 125 and the half bridge's upper device 127. The negative terminals of the DUT 101 and the capacitor 125 are connected. A processor 110 can include circuitry to calculate the electrical performance of the DUT or other electrical signals in the system 100.

The inductor 123 can be an air-cored inductor for use in the double-pulse testing. The inductor 123 includes an inductance that is approximately constant throughout a wide range of current levels during the test (e.g., 1 A to 1000 A). The inductor 123 does not have a saturation problem of the magnetic core inductor, since it does not have a magnetic core. However, air-cored inductors have their own drawback, which is low energy density, leading to large size and small inductance. To ensure an almost constant current during the switching transients, the load inductance at the inductor 123 is very high in order to satisfy the requirements at low current, high voltage operating points. As a consequence, the inductor volume is large, and the energy stored in the inductor is large as well. However, this leads to a long time to ramp up the current at high current, low voltage operating points, and requires a lot of voltage compensation that is lost during charging the inductor. In order to solve this problem, different air-cored inductors, each with different inductances, are used for different operating conditions. In other words, a small inductance is selected for low current cases, while a large inductance is selected for high current cases.

Figure 2:
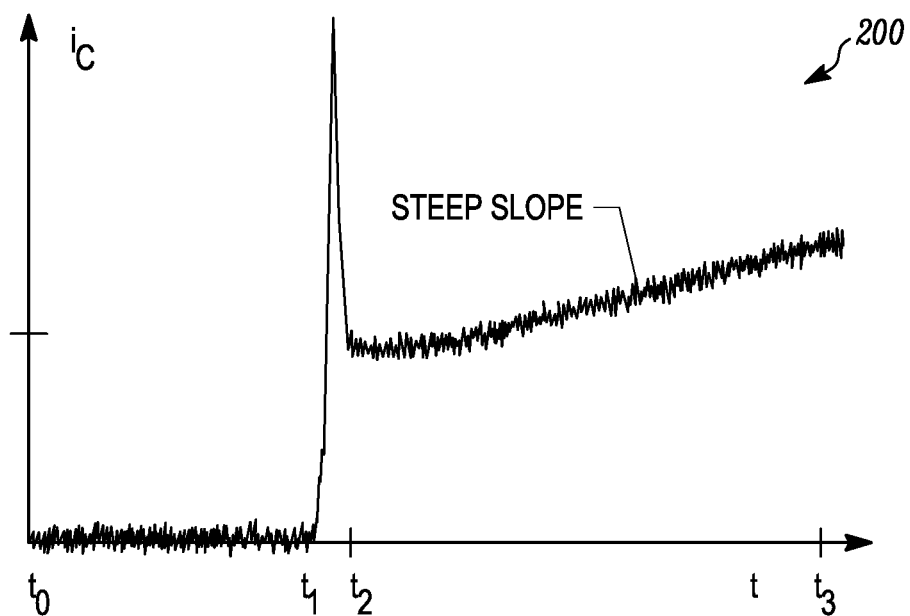
FIG. 2 is a graph of a test waveform.

FIG. 2 shows a graph 200 of a resultant waveform from a double pulse test system without correction utilizing the single, reasonably small air-cored inductor with minimum parasitic capacitance. For extreme cases, such as low current, high voltage cases, the DUT 101 turn-on collector current can have a very steep slope after the DUT's reverse recovery current peak, which is due to the low inductance selected at for the inductor 123. The steep slope can represent a high level portion of the sensed electrical signal that is causing an increase in the current over time. The DUT is turned on at time $t_1$ when the collector current starts to quickly shoot up. After the current reaches the load current, the current does not settle down but appears as an overshoot beyond the load current due to the half bridge's upper device's reverse recovery current. However, after the current overshoot/reverse recovery current, between time t2 and t3 (Δt), the load current continues to increase when it should be constant.

Figure 3:
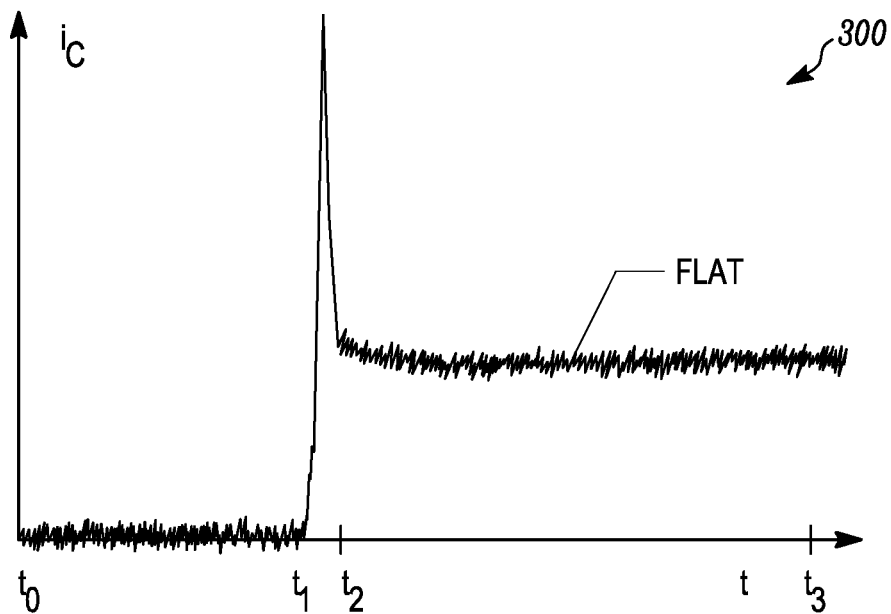
FIG. 3 is a graph of a test waveform after correction according to an example embodiment.

FIG. 3 shows a graph 300 of a resultant waveform from a double pulse test system with correction of the load current. That is the current is essentially flat between time t2 and t3 (Δt). The flat portion of the sensed waveform shown in graph 300 is labelled as flat in FIG. 3 It is flat relative to the uncorrected similar region of FIG. 2. The inductor's contribution to the current can be estimated using the below equation. The change in the current through the DUT, $di_L$, can be subtracted from the current of the DUT during Δt to change the waveform 200 to transform it to waveform 300. The inductor value is L. The time is t. If $v_{dc}$ is not or cannot be measured, then it can be approximated using $v_{ce}$.

$$di_L = \frac{v_L}{L} dt = \frac{v_{dc} - v_{ce}}{L} dt$$

The inductor current can be estimated using the measured values of the voltages in the test system 100. In operation, a first voltage set to a constant to represent a supply voltage. The first voltage can be set to an extracted a high-level portion of a sensed second voltage in various examples.

Here, the high level of $v_{ce}$ can be used as the voltage $v_{dc}$. The high-level portion of $v_{ce}$ occurs before turn on of the DUT, e.g., before time $t_1$ in graphs 200, 300. That is the voltage can be correlated to the value during the current increase, e.g., the slope of graph 200. In another example, the second voltage can be measured across device-under-test. These two voltages can be used to estimate an inductor current change, e.g., as show in graph 200, and the inductor current change can be subtracted to output the correct graph 300.

Figure 4:
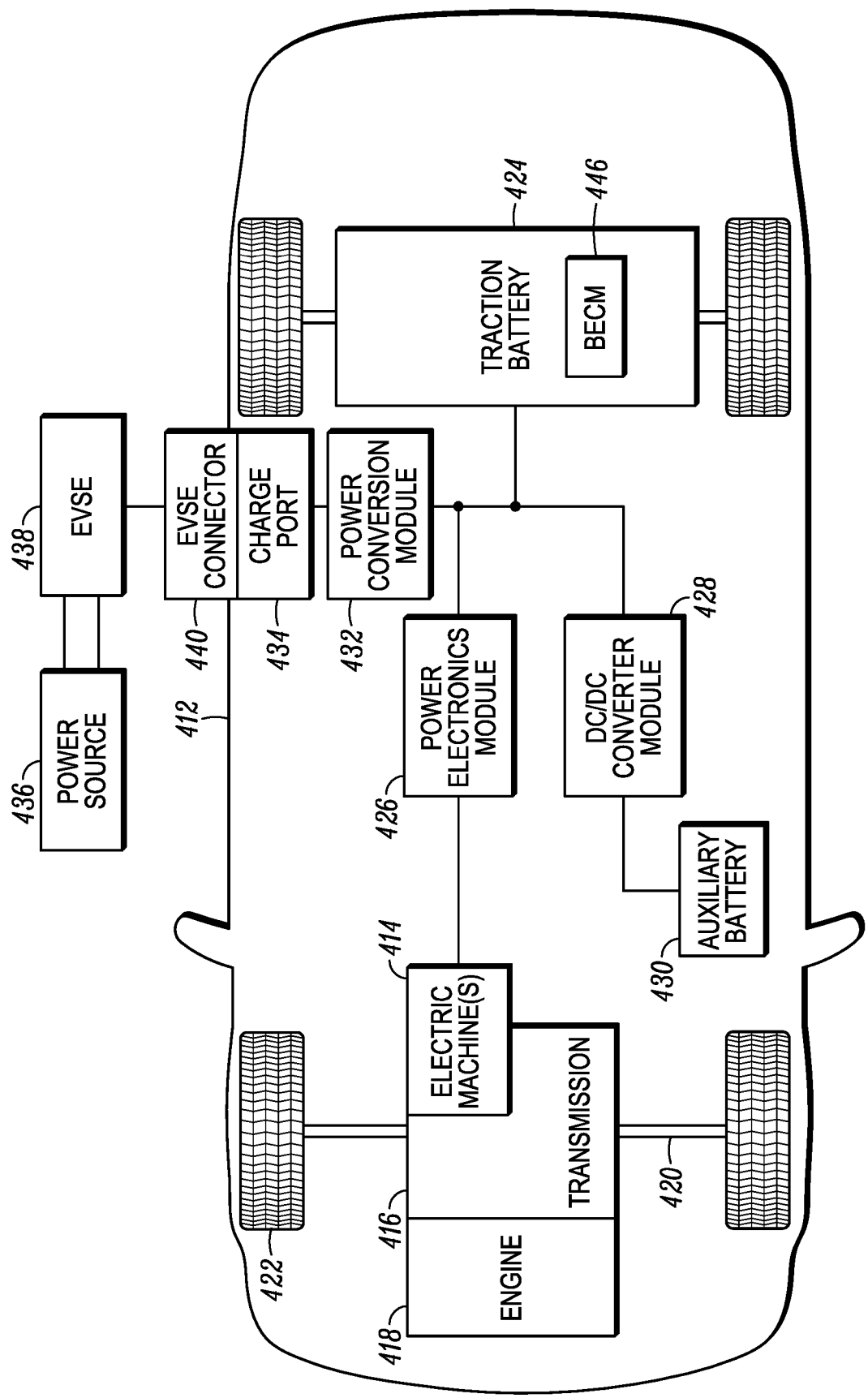
FIG. 4 is a view of an electric powered vehicle according to an example embodiment.

FIG. 4 shows a plug-in, hybrid-electric or electric vehicle 412 may comprise one or more electric machines 414 mechanically connected to a hybrid transmission 416. The electric machines 414 may be capable of operating as a motor or a generator. For hybrid vehicles, a transmission 416 is mechanically connected to an internal combustion engine 418. The transmission 416 is also mechanically connected to a drive shaft 420 that is mechanically connected to the wheels 422. The electric machines 414 can provide propulsion and deceleration capability when the engine 418 is turned on or off. The electric machines 414 also act as generators and can provide fuel economy benefits by recovering energy that would normally be lost as heat in the friction braking system. The electric machines 414 may also reduce vehicle emissions by allowing the engine 418 to operate at more efficient speeds and allowing the hybrid-electric vehicle 412 to be operated in electric mode with the engine 418 off under certain conditions. Similar advantages may be obtained with an electric vehicle that does not include an internal combustion engine 418.

A traction battery or battery pack 424 stores energy that can be used by the electric machines 414. A vehicle battery pack 424 typically provides a high voltage DC output. The traction battery 424 is electrically connected to one or more power electronics modules. One or more contactors (not shown) may isolate the traction battery 424 from other components when opened, and connect the traction battery 424 to other components when closed. The power electronics module 426 is also electrically connected to the electric machines 414 and provides the ability to bi-directionally transfer electrical energy between the traction battery 424 and the electric machines 414. For example, a typical traction battery 424 may provide a DC voltage while the electric machines 414 may require a three-phase AC current to function. The power electronics module 426 may convert the DC voltage to a three-phase AC current as required by the electric machines 414. In a regenerative mode, the power electronics module 426 may convert the three-phase AC current from the electric machines 414 acting as generators to the DC voltage required by the traction battery 424. The description herein is equally applicable to a pure electric vehicle. For a pure electric vehicle, the hybrid transmission 416 may be a gear box connected to an electric machine 414 and the engine 418 may be omitted as previously described. The power electronics module 426 may include a plurality of power integrated circuits, e.g., IGBTs, that are tested according to systems and methods described herein.

In addition to providing energy for propulsion, the traction battery 424 may provide energy for other vehicle electrical systems. A typical system may include a DC/DC converter module 428 that converts the high voltage DC output of the traction battery 424 to a low voltage DC supply that is compatible with other vehicle loads. Other high-voltage loads, such as compressors and electric cabin or component heaters, may be connected directly to the high-voltage without the use of a DC/DC converter module 428. The low-voltage systems may be electrically connected to an auxiliary battery 430 (e.g. a 12V or 24V battery).

Embodiments of this disclosure may include vehicles such as vehicle 412, which may be a hybrid or range-extender hybrid, or an electric vehicle or a plug-in hybrid vehicle in which the traction battery 424 may be recharged by an external power source 436. The external power source 436 may be a connection to an electrical outlet. The external power source 436 may be electrically connected to electric vehicle supply equipment (EVSE) 438. The EVSE 438 may provide circuitry and controls to regulate and manage the transfer of energy between the power source 436 and the vehicle 412. The external power source 436 may provide DC or AC electric power to the EVSE 438. The EVSE 438 may have a charge connector 440 for plugging into a charge port 434 of the vehicle 412. The charge port 434 may be any type of port configured to transfer power from the EVSE 438 to the vehicle 412. The charge port 434 may be electrically connected to a charger or on-board power conversion module 432. The power conversion module 432 may condition the power supplied from the EVSE 438 to provide the proper voltage and current levels to the traction battery 424. The power conversion module 432 may interface with the EVSE 438 to coordinate the delivery of power to the vehicle 412. The EVSE charge connector 440 may have pins that mate with corresponding recesses of the charge port 434. Alternatively, various components described as being electrically connected may transfer power using a wireless inductive coupling. The power conversion module 432 may include power solid state circuitry, e.g., IGBTs, which can be tested according to the systems and methods described herein.

The various components illustrated in FIG. 1 may have one or more associated controllers to control and monitor the operation of the components. The controllers may communicate via a serial bus (e.g., Controller Area Network (CAN)) or via discrete conductors. One or more controllers may also operate in a stand-alone manner without communication with one or more other controllers. One of the controllers may be implemented by a Battery Energy Control Module (BECM) 446 to control various charging and discharging functions and battery cell charge balancing, for example. The BECM 446 may be positioned within traction battery pack 424 and may be connected to one or more sensor modules to sense the voltage across the supercapacitors.

Vehicle traction battery packs may be constructed from a variety of chemical formulations. Typical battery pack chemistries include lead-acid, nickel-metal hydride (NIMH), or Lithium-Ion (Li-Ion). Other traction battery chemistries may be used.

Figure 5:
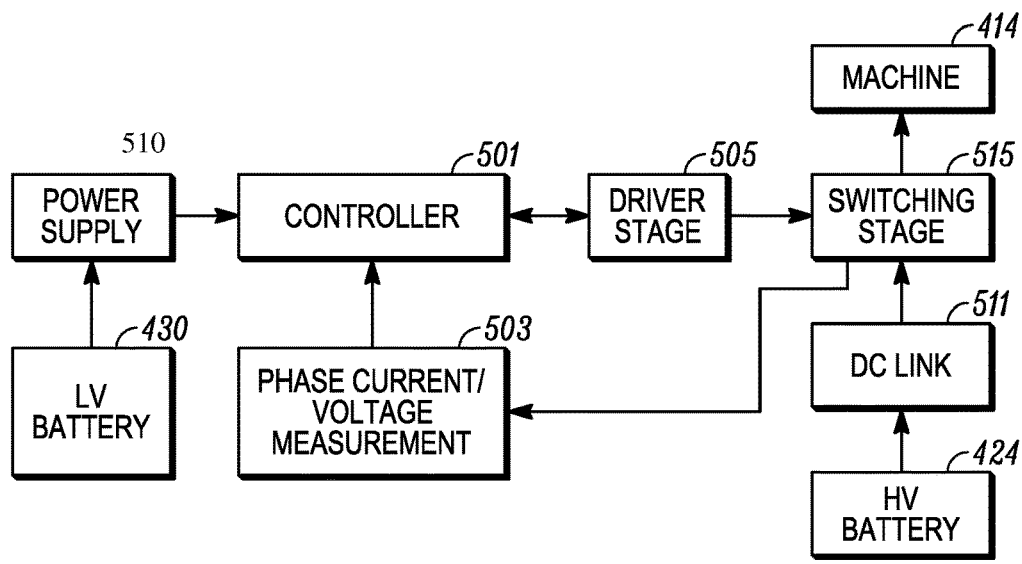
FIG. 5 is a view of an electrical power system for a vehicle according to an example embodiment.

FIG. 5 shows an electrical system for a hybrid or electrical vehicle. The low voltage, auxiliary battery 430 can provide electrical energy through a low voltage power supply 510 to a controller 501. The high voltage battery 424 is a traction battery and provides electrical energy to drive the vehicle 412. A DC-link capacitor 511 smoothes the electrical signal from the high-voltage battery to the switching stage 515. The switching stage 515 can act as an inverter to supply the electrical drive signal to the electrical machine(s) 414 providing motive force to the vehicle 412. The switching stage 515 can include power integrated circuits, e.g., IGBTs. The switching stage 515 should be designed to minimize switching losses and maximize thermal efficiency. Not only does the inverter 515 drive the electric motor 414, it may also capture energy released through regenerative breaking and feed this back to the high voltage battery 424. The switching stage 515, and individual components thereof, can be tested to minimize switching losses using the systems and methods described herein. A phase current and voltage measurement stage 503 measures the electrical signals output from the switching stage 515 and outputs the results to controller 501. The controller 501 can use the measurements from the stage 503 to output control signals to driver stage 505, which in turn controls the operation of the switching stage 515. The controller 501 can also use phase current measurement and/or voltage measurements from the measurement stage 503 to control the driver stage 505.

The vehicle 412 may include power control circuitry coupled that includes a device-under-test (DUT) as described herein. The DUT may include an electronic power device, e.g., switches, IGBTs, FETs, and the like. Using the systems and structures for double pulse testing described herein, the switching loss of the electronic power device can be estimated. The double pulse test may be performed with an air core inductor acting as the inductive load to correct collector current estimation with the DUT in the on state or other losses. A controller, e.g., BECM 446 or other vehicle processing circuitry, can estimate traction battery charge remaining using the losses estimated using the double pulse test. The more precise the estimate of the losses, e.g., by knowing the exact behavior of the DUT or each of the DUT in the vehicle, can result in a more precise estimation of SOC, charge reminding or travel distance remaining. These are desired by the vehicle operators.

Figure 6:
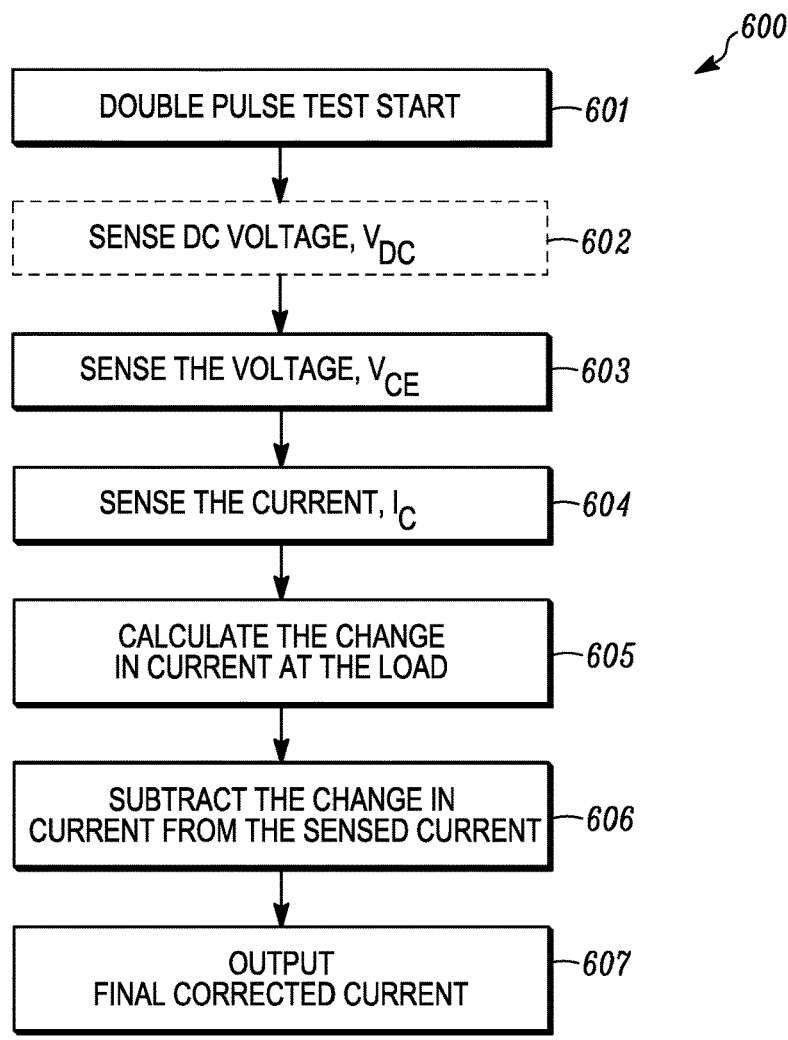
FIG. 6 is a flow chart of a method for a double pulse test according to an example embodiment.

FIG. 6 shows a method 600 for double pulse testing with a testing system with only a single, reasonably small air-cored inductor with minimum parasitic capacitance being used as the load. At 601, a double pulse test is started. At 602 an optional step of measuring the voltage across the source capacitor, $v_{dc}$, can be performed. At 603, the voltage across the DUT, $v_{ce}$, is measured. At 604, the current flowing through the DUT, $i_c$, is measured. At 605, the change in current across the inductive load is calculated using the equation above. At 606, the corrected current is obtained by subtracting the calculated change in current from the sensed current. At 607, the final, corrected current is output, e.g., to a display on an electrical device connected to a computer. The display may show graphs similar to those in FIGS. 3-4. While the method 600 can be performed in the steps as ordered, some steps, e.g., steps 602-604, can be performed in any order or simultaneously.

The present description focuses on the DUT turn-on operation. It will be recognized that similar procedure can be done for DUT turn-off. Similar calculations be performed to correct for the change in current across the DUT.

The operation of the diode during turn-on or turn-off does not need this compensation as the voltage across the inductor during diode on is as small as the diode on-state voltage, which is a couple of volts. Therefore, the change in current, Δi, is very minimum during diode on.

It is believed that the use of a single and small air-cored inductor, which occupies only a small volume and is light weight, can be used for a wide range of operating conditions without changing the inductor. By compensating for the inductor rising current it can ensure the highest accuracy for a switching loss calculation. The inductor can provide an inductance of about 10 μH up to about 20 μH or in a range of about 1 μH to 1 mH, or other values descro.

The double pulse test as described herein may be used to determine various properties of the device under test. The properties may include device behavior at different temperature levels, short circuit behavior and short circuit shutdown, behavior of the gate drive, adjustment of gate resistance on or gate resistance off, over-voltage behavior on turning the device off, e.g., adjustment of active clamping, current distribution when connected in parallel, diode recovery, or measurement of switching energies. The present double pulse test described herein can be used with power electronic devices, e.g., IGBT, or with other electronic devices, e.g., mosfets.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A double-pulse test method, comprising:
by a processor,
operating a device under test (DUT), coupled to an inductive load defined by an air-core inductor, according to a double-pulse test schedule; and
calculating a corrected collector current of the DUT from a difference between (i) a measured collector current of the DUT and (ii) a change in current through the air-core inductor that is based on a first sensed voltage across a supply capacitor and a second sensed voltage across the DUT.

2. The method of claim 1, wherein the change in current, $di_L$, the first sensed voltage, $v_{ce}$, and the second sensed voltage, $v_{dc}$, are related according to $$di_L = \frac{v_{dc} - v_{ce}}{L} dt$$

where L is an inductance of the air-core inductor.

3. The method of claim 2, wherein the inductance is about 10-80 μH.

4. A double-pulse test method, comprising:
by a processor,
operating a device under test (DUT), coupled to an inductive load defined by an air-core inductor, according to a double-pulse test schedule;
calculating a corrected collector current for the DUT from a difference between (i) a measured collector current of the DUT and (ii) a change in current through the air-core inductor that is based on a first voltage set as a constant to represent a supply voltage and a second sensed voltage across the DUT.

5. The method of claim 4, wherein the change in current, $di_L$, the first voltage, $v_{ce}$, and the second voltage, $v_{dc}$, are related according to $$di_L = \frac{v_{dc} - v_{ce}}{L} dt$$

where L is an inductance of the air-core inductor.

6. The method of claim 5, wherein the inductive load has an inductance of about 10-20 μH.

7. The method of claim 5, wherein the inductive load has an inductance of about 1 uH to 1 mH.

* * * * *